United States Patent
Haffner et al.

(10) Patent No.: US 6,426,269 B1
(45) Date of Patent: Jul. 30, 2002

(54) DUMMY FEATURE REDUCTION USING OPTICAL PROXIMITY EFFECT CORRECTION

(75) Inventors: Henning Haffner, Fishkill, NY (US); Heinz Hoenigschmid, Starnberg (DE); Donald J. Samuels, Silverthorne, CO (US)

(73) Assignees: International Business Machines Corporation, Armonk, NY (US); Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/422,634

(22) Filed: Oct. 21, 1999

(51) Int. Cl.⁷ ................................................ H01L 21/76
(52) U.S. Cl. ........................................ 438/401; 430/403
(58) Field of Search .................... 438/401; 430/403; 257/207

(56) References Cited

U.S. PATENT DOCUMENTS

| | | | | |
|---|---|---|---|---|
| 5,216,257 A | * | 6/1993 | Brueck et al. | 250/548 |
| 5,723,233 A | * | 3/1998 | Garza et al. | 430/5 |
| 5,759,744 A | * | 6/1998 | Brueck et al. | 430/312 |
| 5,847,421 A | | 12/1998 | Yamaguchi | 257/207 |
| 5,858,591 A | * | 1/1999 | Lin et al. | 430/30 |
| 6,042,998 A | * | 3/2000 | Brueck et al. | 430/316 |
| 6,077,310 A | * | 6/2000 | Yamamoto et al. | 716/19 |
| 6,114,071 A | * | 9/2000 | Chen et al. | 430/5 |
| 6,120,953 A | * | 9/2000 | Lin | 430/30 |
| 6,178,360 B1 | * | 1/2001 | Peirrat et al. | 700/121 |

* cited by examiner

Primary Examiner—John F. Niebling
Assistant Examiner—Olivia Luk
(74) Attorney, Agent, or Firm—Steven Capella (57) ABSTRACT

A method, and a system for employing the method, for providing a modified optical proximity correction (OPC) for correcting distortions of pattern lines on a semiconductor circuit wafer. The method comprises producing a mask having one or more pattern regions, and producing the semiconductor circuit wafer from the mask. The pattern regions include one or more non-edge pattern regions located adjacent to other of the non-edge pattern regions on the mask. The pattern regions further include one or more edge pattern regions located at or near an area on the mask not having the other non-edge pattern regions. The edge pattern regions have widths calculated to minimize the variance in dimensions between one or more pattern lines on the semiconductor circuit wafer formed from them and one or more pattern lines on the semiconductor circuit wafer formed from the non-edge pattern regions. The distances between any two of the pattern regions are calculated to minimize the variance in dimensions between the one or more pattern lines formed from the edge pattern regions and the one or more pattern lines formed from the non-edge pattern regions. The above producing step includes producing the semiconductor circuit wafer from the mask having the pattern lines formed from the non-edge pattern regions and having the pattern lines formed from the edge pattern regions, where the pattern lines formed from the non-edge regions are permitted to differ in distances between them.

10 Claims, 8 Drawing Sheets

DUMMY FEATURE REDUCTION USING OPTICAL PROXIMITY EFFECT CORRECTION

BACKGROUND OF THE INVENTION

1. Field of the Invention

The following invention relates to semiconductor device fabrication and more particularly to lithography techniques for reducing the real estate taken to form integrated circuits.

2. Related Art

Semiconductor device manufacturing is basically done by laying out a design, transferring the design to a photolithography mask, and printing the design pattern onto a semiconductor substrate or wafer.

Semiconductor chips are manufactured using a series of masks in the lithographic process. During lithography, successive patterns of materials on and regions in a semiconductor wafer are chemically or photochemically induced onto the surface of the wafer using the mask as a template. The patterns, including lines and holes, define the circuit elements, such as transistors.

Initially, the semiconductor wafer is covered with resist material, such as photoresist. The resist material is responsive to incident energy, such as an electromagnetic radiation. Examples of electromagnetic waves used are visible light, ultraviolet light, electron beams, and x-rays. Where the resist material is exposed to the radiation, it chemically activates the resist, by for example etching a hole in the substrate.

In lithography, the mask is used to determine where the electromagnetic radiation is permitted to contact the resist material. The mask functions to mask certain regions of the resist material from the incident energy but not other regions, by permitting the radiation to pass through some regions (called transmissive regions), and preventing the radiation from passing through other regions (called non-transmissive regions).

There are different types of lithography. One type of lithography uses projection optics. In a typical state of the art tool of this type of lithography, the pattern on the mask is reduced in size using special optical lenses before being transmitted to the resist material using the incident energy. This permits the mask to be produced more easily and cost-effectively. For example, the mask pattern can be reduced four times from its original size to create the actual pattern on the substrate. In this manner, the pattern on the mask is used to create pattern lines or grooves on the substrate.

The pattern lines are used to create semiconductor devices, such as transistors. For a typical DRAM chip, enormous arrays of memory cells are created from the transistors, which in turn are comprised of the drawn pattern lines. The memory cells are very regular structures, of infinitesimal size. For modern chips, pattern lines having dimensions on the order of less than 200 nanometers need to be drawn, to keep the size of the chip small.

As noted, in one type of lithography, optical equipment is used to transfer the mask pattern onto the resist material. As a result of the optical interference which occur during pattern transfer, images formed on the device substrate deviate from their ideal dimensions and shape as represented on the mask. With current technologies, the dimensions of the pattern lines are on the order of, or even smaller than, the wavelengths of the incident energy (e.g., photo source) exposed to the resist (e.g., photoresist) material.

These deviations depend on the characteristics of the patterns as well as a variety of process conditions. These deviations are usually referred to by the term optical proximity effect. Their degree of severity depend on the resolution capability of an optical lithography system. The resolution is defined by the equation $k_1 \lambda / NA$, where $k_1$ is a constant, $\lambda$ is the illumination wavelength, and NA is the numerical aperture of the imaging system.

Optical lithography for a $k_1$ factor below 0.5 complicates proximity curves immensely, which means the mentioned deviations of the printed patterns from the original mask pattern increase further. For example, a problem arises in that if the process is optimized for the array of DRAM devices (e.g., equal lines and spaces), then more isolated lines outside the array could be printed smaller or larger depending on the line width and the environment, or surrounding composition of the shape placements. These effects may even result in disappearing lines or spaces. These deviations have the disadvantage of significantly reducing chip performance, possibly even causing the chip to fail.

Alternatively to the costly development of processes with ever higher effective resolution is the selective biasing of mask patterns to compensate for the pattern distortion occurring during wafer processing. The term "optical proximity correction" (OPC) is used to describe the process of selective mask biasing, even though the trend exists to include pattern distortions unrelated to the optical image transfer.

Many approaches have been pursued to compensate for the results of the optical interference occurring during pattern transfer, namely that the images formed on the device substrate deviate from their ideal images. Usually the process is optimized for one feature type such as the DRAM array and as a result other features, such as isolated lines or spaces, are degraded in their lithographic capability.

To defeat these negative effects, developers have used a variety of techniques. One technique is to increase the NA, to effect the resolution defined by $k_1 \lambda / NA$. Another technique is to modify the coherence of the incident energy (e.g., incident light source). Another technique is to reduce the wavelength of the illumination. Another technique is to phase shift the mask. The invention disclosed here can be used on a binary or phase shifted mask.

One technique is to modify the dimensions of the mask, such that the mask images used generate the edge pattern lines at different dimensions from the non-edge pattern lines. This is a type of OPC solution. A computer processor is used to generate the amount of the mask image distortions, such that when the patterns are transferred onto the substrate and the inevitable optical proximity effects take place, the edge pattern lines are of the same dimensions as the non-edge pattern lines. Unfortunately, it is a difficult, time-consuming, and often non-effective enterprise to account for the proximity effects by distorting the mask patterns. Additionally, there are cases for which there is no such exact OPC solution.

Another technique has been to add so-called "dummy" lines at the end of the arrays. Additional pattern lines, other than the number of pattern lines desired, are added at the edges of the arrays. It is these dummy lines that are distorted during photolithography, and the first non-dummy line is now in an array-like environment.

Unfortunately, the dummy lines are wasteful of space on the chip. The smaller the $k_1$ constant gets, the more additional dummy lines that must be added.

What is required is a way of preventing or minimizing these deleterious effects without sacrificing cost and real estate on the chip, or providing an enormous amount of additional processing.

SUMMARY OF THE INVENTION

The present invention is directed to a method, and a system for employing the method, for providing a modified optical proximity correction (OPC) for correcting distortions of pattern lines on a semiconductor circuit wafer. The method comprises producing a mask having one or more pattern regions, and producing the semiconductor circuit wafer from the mask.

The pattern regions include one or more non-edge pattern regions located adjacent to other of the non-edge pattern regions on the mask. The pattern regions further include one or more edge pattern regions located at or near an area on the mask not having the other non-edge pattern regions.

The edge pattern regions have widths calculated to minimize the variance in dimensions between one or more pattern lines on the semiconductor circuit wafer formed from them and one or more pattern lines on the semiconductor circuit wafer formed from the non-edge pattern regions.

The distances between any two of the pattern regions are calculated to minimize the variance in dimensions between the one or more pattern lines formed from the edge pattern regions and the one or more pattern lines formed from the non-edge pattern regions.

The above producing step includes producing the semiconductor circuit wafer from the mask having the pattern lines formed from the non-edge pattern regions and having the pattern lines formed from the edge pattern regions, where the pattern lines formed from the non-edge regions are permitted to differ in distances between them.

The method further includes creating a design layout for the semiconductor circuit wafer; and producing the mask from the design layout. The producing step can be performed using optical photolithography. This includes radiating an energy source through the pattern regions, the energy source having a wavelength in the range of the widths of the pattern lines formed from the non-edge pattern regions and the widths of the pattern lines formed from the edge pattern regions. It can also include reducing the pattern regions in size by a fixed multiple to produce the pattern lines formed from the non-edge pattern regions and the pattern lines formed from the edge pattern regions.

The method includes using an OPC tool to calculate the widths of the edge pattern regions. The dimensions of the pattern lines can be widths of the pattern lines.

The above-noted any two pattern regions can include one of the non-edge pattern regions and one of the edge pattern regions. Also, these any two pattern regions can include a first of the edge pattern regions and a second of the edge pattern regions. Finally, the any two pattern regions can include a first of the pattern regions and a second of the pattern regions positioned adjacent to one another.

BRIEF DESCRIPTION OF THE FIGURES

The present invention will be described with reference to the accompanying drawings, wherein.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
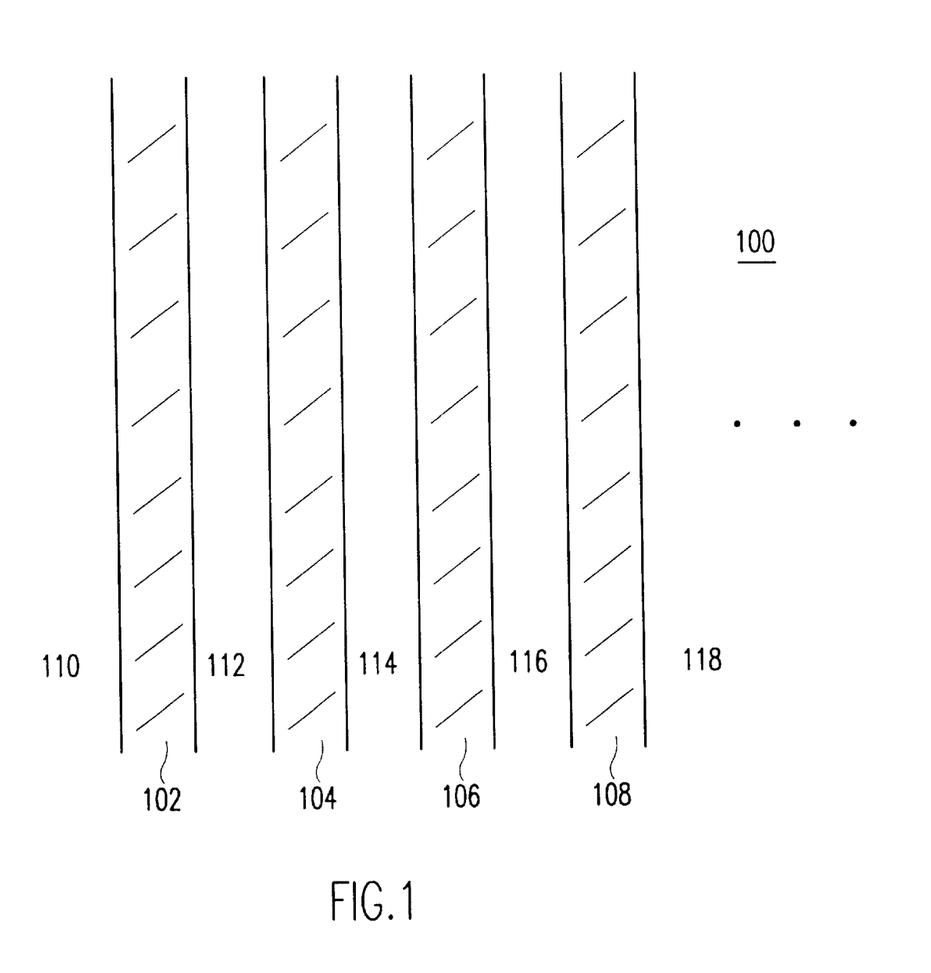
FIG. 1 illustrates a series of pattern images on a mask.

FIG. 1 illustrates a series of pattern images on a mask 100. Mask 100 comprises a series of transmission regions 102, 104, 106, 108, and a series of non-transmission regions 110, 112, 114, 116, 118, located between the transmission regions 102–108. The series of pattern images 100 is the exact same as in a design layout (not shown) from which the mask is created.

When an incident energy source is directed at mask 100, the incident energy can penetrate regions 102, 104, 106 and 108, but is blocked by regions 110, 112, 114, 116 and 118. The mask is placed on top of a photoresist material, which is in turn placed over a wafer substrate.

When the incident energy penetrates regions 102–108, it activates the photoresist material placed underneath it, to cause a hole or recess to be induced onto the wafer. Each such induced area on the wafer is referred to as a pattern line or printed line.

The terminology used to describe the type of photoresist material is provided for explanatory purposes only. In actuality, photoresist can have either a positive or negative polarity. When the photoresist is positive, then the photoresist is removed where exposed and left where not exposed. The opposite is true of negative photoresist. In the present invention, either polarity can be used. Therefore, although regions 102–108 (and similarly labeled and described items) are referred to as "transmission regions", they are only transmission regions if positive photoresist is used. Since it is also possible to use negative photoresist, it is more accurate to refer to the "transmission regions" as pattern regions.

The array of regions 102–108 continue seemingly indefinitely, for a finite amount, toward the right. Region 102 is illustrated to be on an edge of the array of regions, meaning that it is the last region in the array. Regions 102–108 are located an equivalent distance from one another.

One or more optical lenses is used to reduce the pattern on mask 100 onto a wafer. The resolution capability of the system is limited, however. Specifically, the resolution capability of an optical lithography system is defined by the equation Resolution=$k_1 \lambda / NA$, where $k_1$ is a constant, $\lambda$ is the illumination wavelength, and NA is the numerical aperture of the imaging system.

Figure 2A:
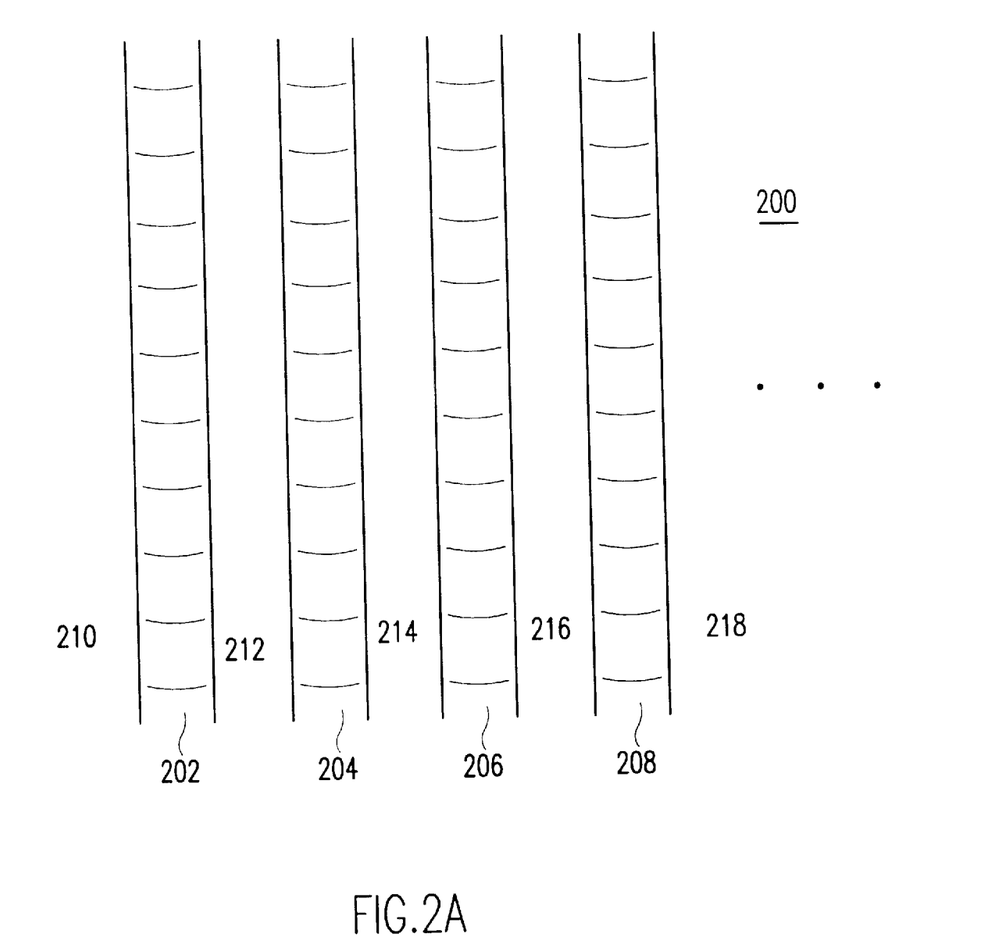
FIG. 2A illustrates a series of pattern lines on a wafer where the constant $k_1$ is large.

FIG. 2A illustrates a series of pattern lines on a wafer 200 where $k_1$ is large. The pattern lines result from the pattern images of a mask being induced onto wafer 200. Illustrated therein are pattern lines 202, 204, 206 and 208. Between these pattern lines are regions 210, 212, 214, 216 and 218. The array of pattern lines 202–208 continue seemingly indefinitely, for a finite amount, toward the right. Pattern line 202 is illustrated to be on an edge of the array of pattern lines, meaning that it is the last pattern line in the array. Pattern lines 202–208 are located an equivalent distance from one another.

As noted, mask "holes" or regions (like regions 102–108) are used to create pattern lines 202–208. In the present embodiment, projection objects are used to reduce regions 102–108 to create pattern lines 202–208. For example, pattern lines 202–208 can be created to be identical to regions 102–108, but 4 times smaller in size. This reduces the difficulty and costs associated with designing mask 100.

In FIG. 2A, the value of $k_1$ is relatively large. This means the wavelength of the light $\lambda$ is much smaller than the dimensions of the objects ("holes" or pattern lines) that are to be printed. For this reason, the last lines of the array of pattern lines (e.g., 202, 204, 206) are printed no differently than the other pattern lines. In other words, the lines of the array located at or close to the edges have respective line widths that are the same as the other lines and have locations of placement to neighboring lines equivalent to the placement of the other lines to their neighboring lines. For this reason, the last lines of the array are equivalent to the other lines of the array in their electrical conductivity capacity.

Figure 2B:
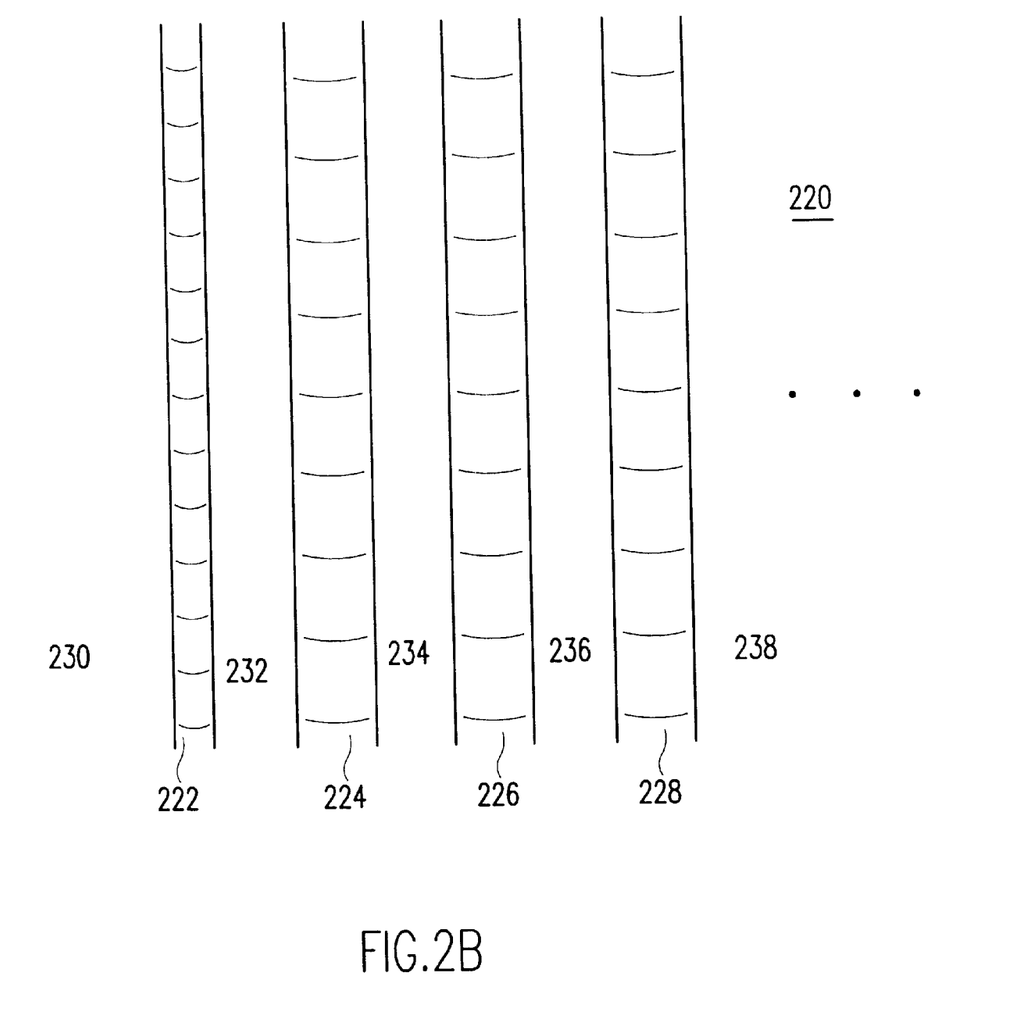
FIG. 2B illustrates a series of pattern lines on a wafer where the constant $k_1$ is small.

FIG. 2B illustrates a series of pattern lines on a wafer 220 where $k_1$ is small. The pattern lines result from the pattern images of a much smaller mask being induced onto wafer 220. Illustrated therein are pattern lines 222, 224, 226 and 228. Between these pattern lines are regions 230, 232, 234, 236 and 218. Pattern line 222 is illustrated to be on an edge of the array of pattern lines, meaning that it is the last pattern line in the array. Pattern lines 222–228 are located an equivalent distance from one another.

Wafer 220 is similar to wafer 200 of FIG. 2A in other respects as well. Mask "holes" (or regions) are used to create pattern lines 222–228. In the present embodiment, projection objects are used to reduce the regions create pattern lines 222–228. For example, pattern lines 222–228 can be created to be identical to regions 102–108, but 4 times smaller in size, which reduces the difficulty and costs associated with designing mask 100.

In FIG. 2B, however, the value of $k_1$ is relatively small. This means the wavelength of the light $\lambda$ is in the range of, or equal to, the dimensions of the objects ("holes" or pattern lines) that are to be printed. For this reason, the last pattern line or lines of the array of pattern lines (e.g., 222) can be printed differently than the other pattern lines. Referring to FIG. 2B, pattern line 222 is thinner in width than the other pattern lines (i.e., 224, 226). Therefore, pattern line 222 is not equivalent to the other lines of the array in its electrical conductivity capacity.

Figure 3A:
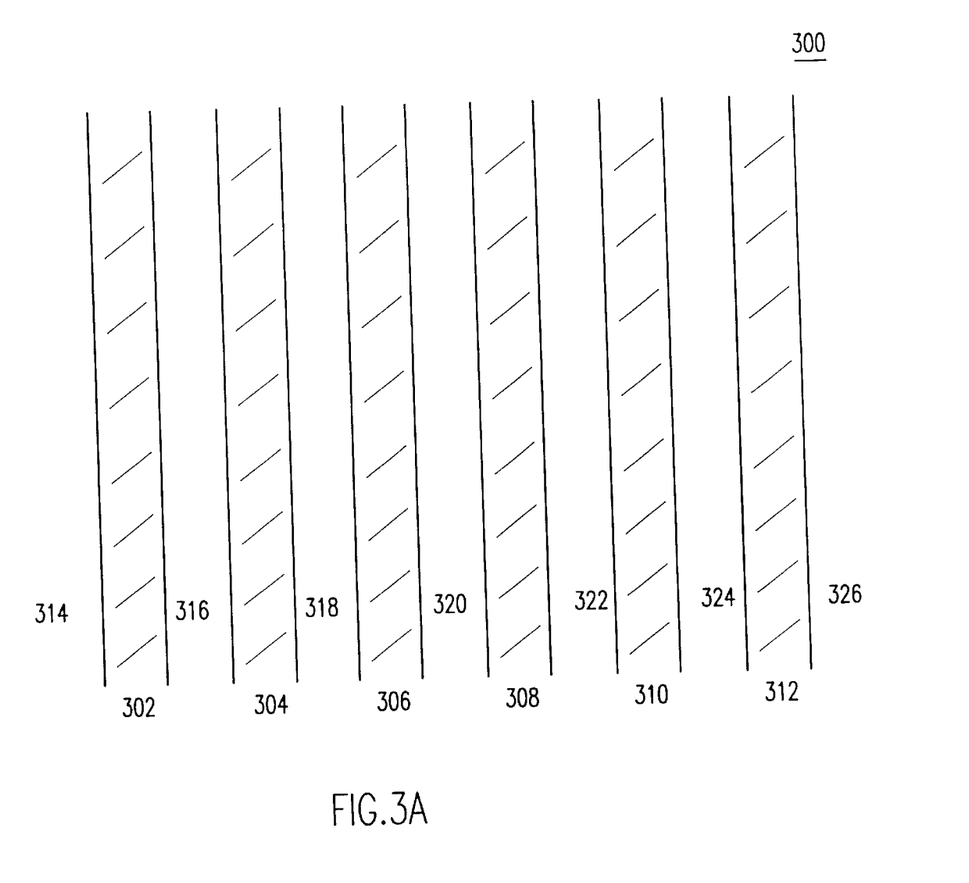
FIG. 3A illustrates a series of pattern images on a mask for an embodiment using "dummy pattern lines"
Figure 3B:
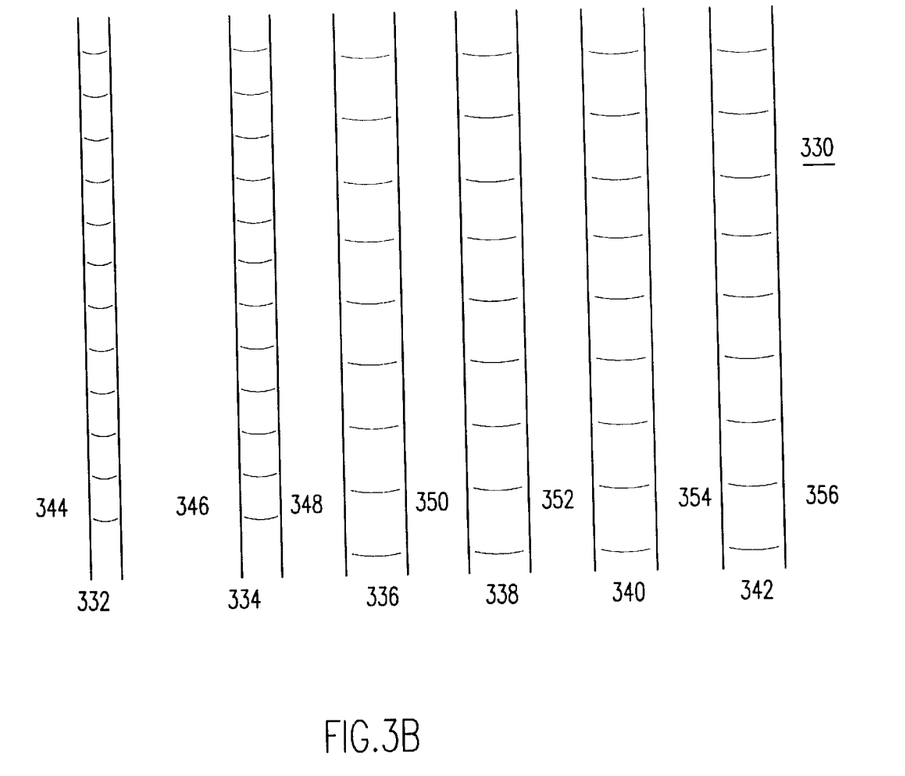
FIG. 3B illustrates a series of pattern lines on a wafer for an embodiment using "dummy pattern lines"

FIGS. 3A and 3B are used to illustrate how "dummy" pattern lines can be used to prevent the distortion at the edges of an array, where $k_1$ is small. FIG. 3A illustrates a series of pattern images on a mask 300. Mask 300 comprises a series of transmission regions 302–312 and a series of non-transmission regions 314–326, located between the transmission regions 302–312. The series of pattern images 300 is the exact same as in a design layout (not shown) from which the mask is created. Mask 300 of FIG. 3A is different from mask 100 in that additional regions 314, 316 have been added to the edge.

FIG. 3B illustrates a series of pattern lines on a wafer 330 where $k_1$ is small. Wafer 330 has been created from mask 300 through photolithography, meaning that mask 300 has been induced onto wafer 220. In actuality, mask 300 has been proportionally reduced by a predetermined amount to create wafer 330. Illustrated therein are pattern lines 332–342. Between these pattern lines are regions 344–356. As shown, pattern lines 332, 334, which are on the edge of the wafer 330 pattern line array, have smaller widths than the remainder of the lines 336–342. This is disadvantageous, because the electrical conductivity of these lines will be different from that of lines 336–342. However, as noted, pattern lines 332, 334 were created as dummies, from additional regions 302, 304. Accordingly, dummy pattern lines are not wired up in the circuitry and are not used.

Figure 4A:
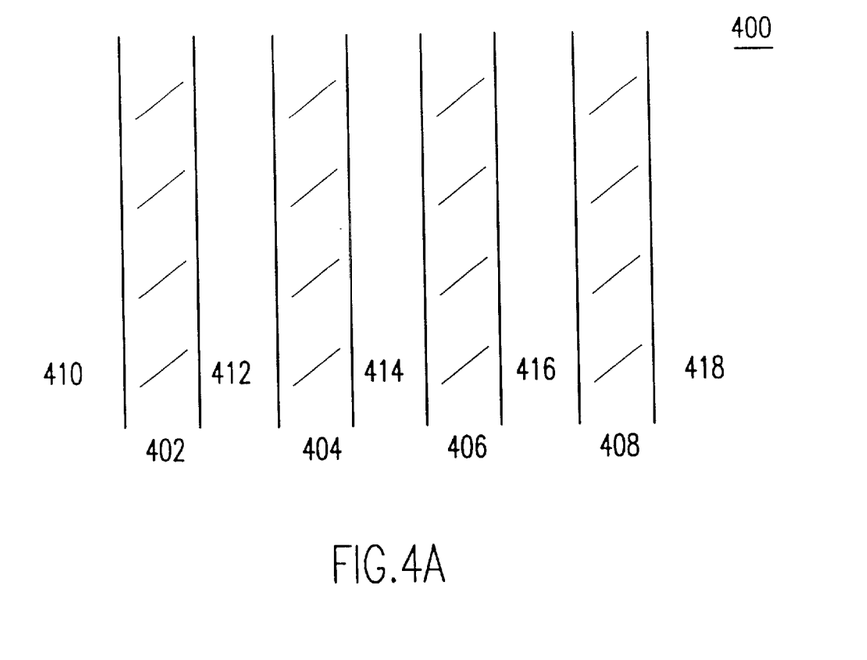
FIG. 4A illustrates the design layout from which a mask is created for an embodiment using "optical proximity correction" (OPC)
Figure 4B:
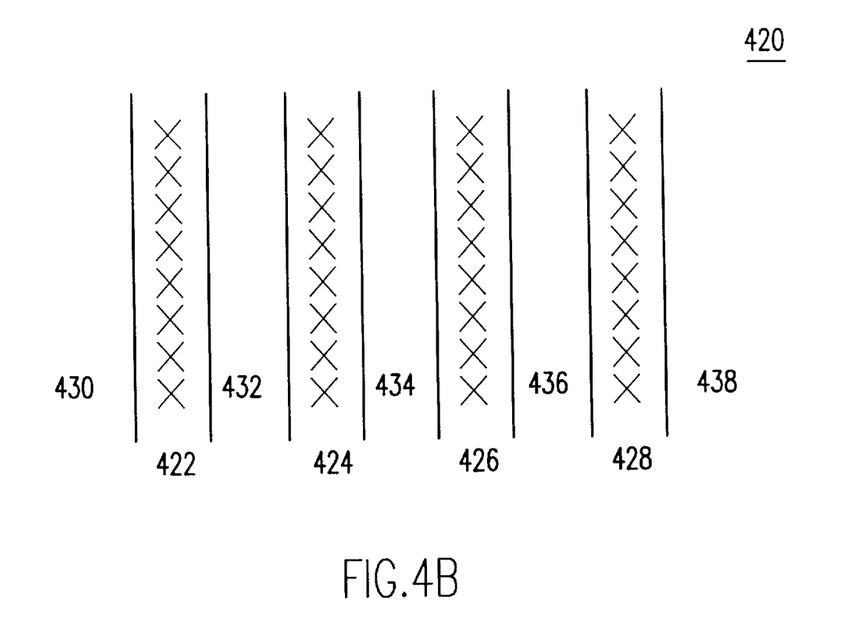
FIG. 4B illustrates a mask for an embodiment using OPC.
Figure 4C:
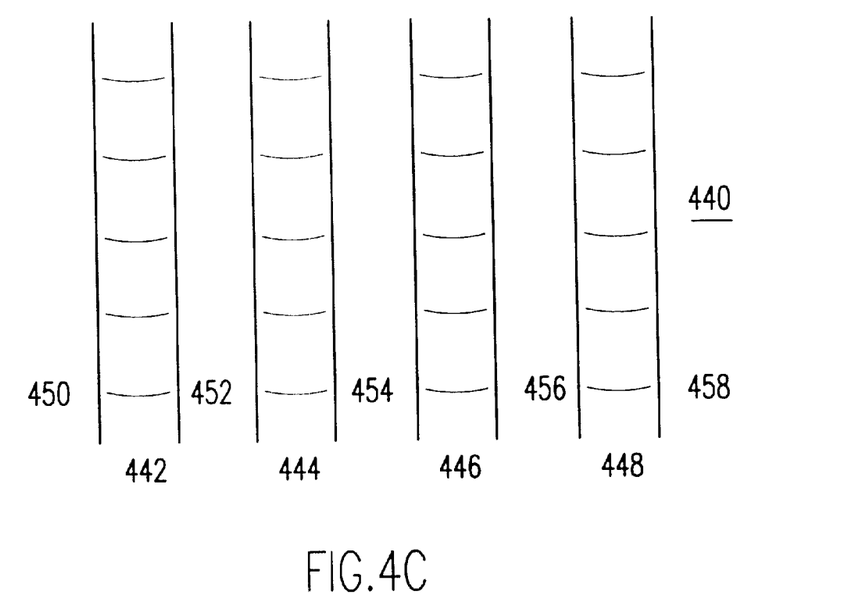
FIG. 4C illustrates pattern lines on a wafer for an embodiment using OPC.

FIGS. 4A, 4B, and 4C are used to illustrate an "optical proximity correction" (OPC) method, used where $k_1$ is small. OPC correction is preferential to using dummy lines, in that valuable chip space and processing efforts are not wasted in creating, and discarding dummy lines. However, with OPC, there is no guarantee of a solution to the distortion at the edge pattern lines, as discussed below.

FIG. 4A illustrates the design layout 400 from which the mask is created. Design layout 400 comprises regions 402–408. Between regions 402–408 are regions 410–418. In non-OPC methods, the mask is created to be identical to the design layout.

However, FIG. 4B illustrates an OPC mask 420 created from design layout 400. As shown, inner regions 424–428 are created identical to design layout regions 402–408 in width and distance to one another. However, in order to compensate for the change in size of the pattern lines at the edges of the array, from the transfer of mask to wafer, regions 422, 424 at the edges of the mask are purposely made larger in size than design layout regions 402, 404.

FIG. 4C illustrates pattern lines 442–448 on wafer 440. Pattern lines 442–448 are created by OPC photolithography from mask 420. Between pattern lines 442–448 are regions 450–458. The correction applied by OPC may only hold for a single exposure dose and focus condition. As these two factors vary, lines 442 and 444 may not have the same process window as lines 446 and 448. They may even disappear or merge.

Figure 5A:
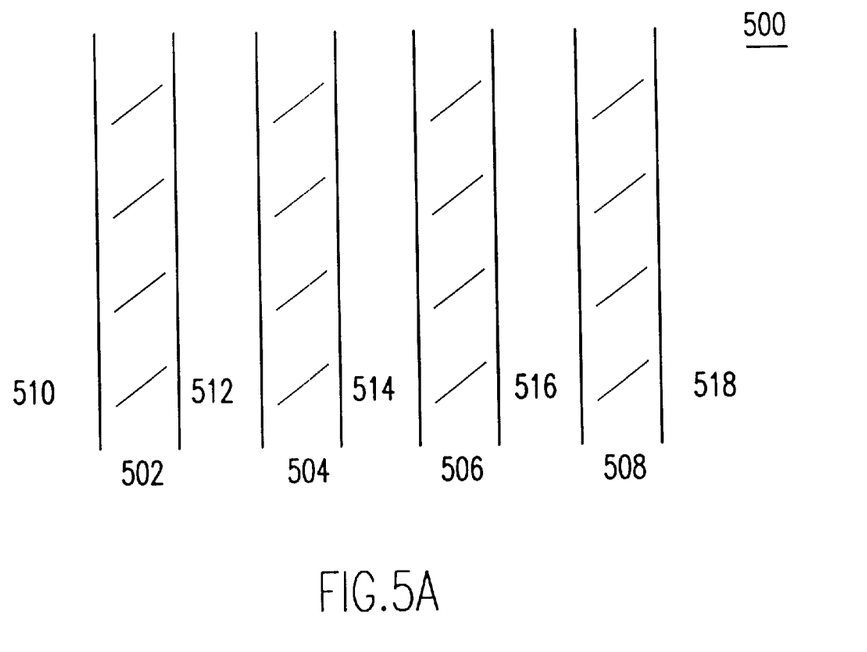
FIG. 5A illustrates the design layout from which a mask is created for an embodiment using modified "optical proximity correction" (OPC)
Figure 5B:
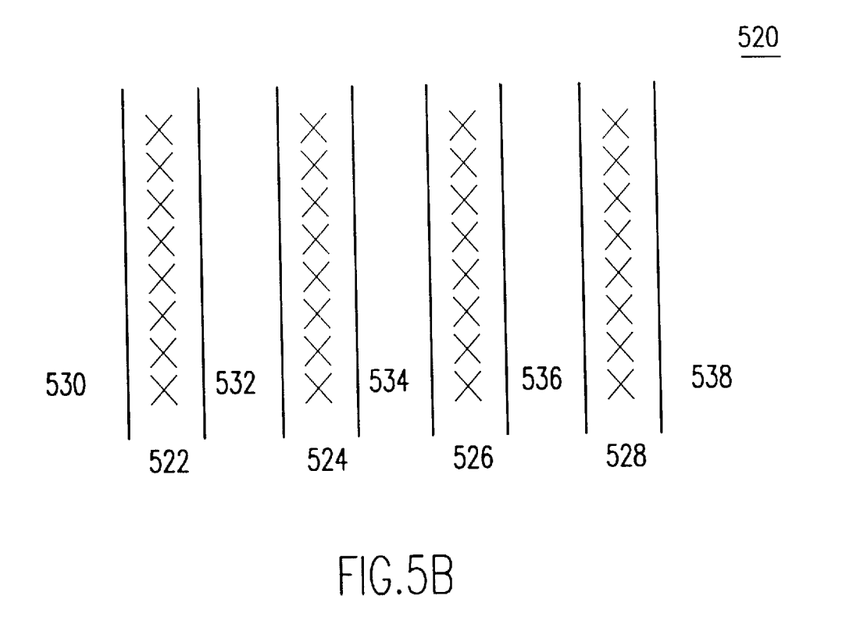
FIG. 5B illustrates a mask for an embodiment using modified OPC.
Figure 5C:
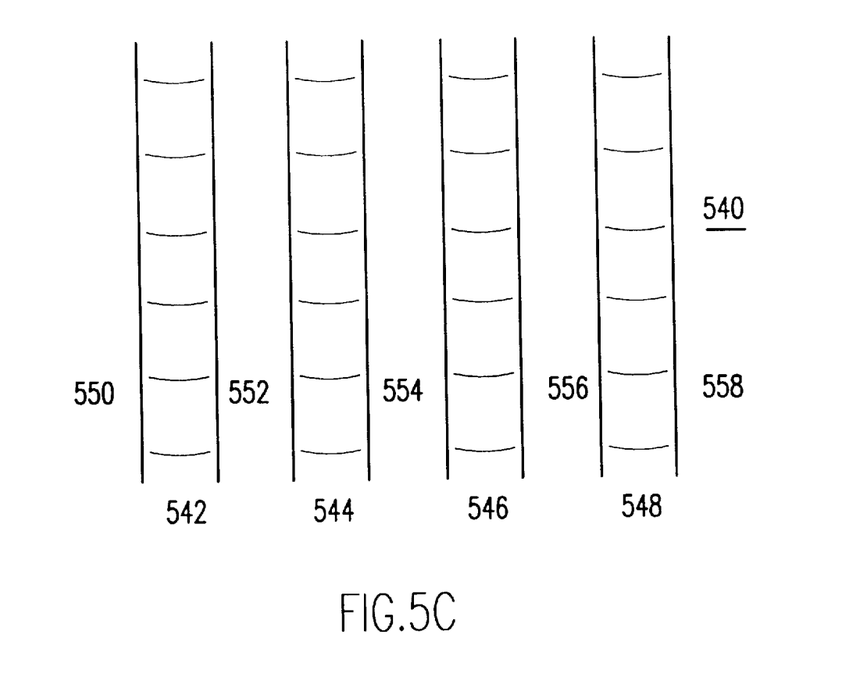
FIG. 5C illustrates pattern lines on a wafer for an embodiment using modified OPC.

FIGS. 5A, 5B, and 5C are used to illustrate a modified OPC method, used where $k_1$ is small. FIG. 5A is identical to FIG. 4A. FIG. 5A illustrates the design layout 500 from which the mask is created. Design layout 500 comprises regions 502–508. Between regions 502–508 are regions 510–518.

FIG. 5B is identical to FIG. 4B with one important difference. Similarly to FIG. 4B, FIG. 5B illustrates an OPC mask 520 created from design layout 500, with inner regions 522–528 created identical to design layout regions 502–508 in width and distance to one another. Similarly, in order to compensate for the change in size of the pattern lines at the edges of the array, from the transfer of mask to wafer, regions 522, 524 at the edges of the mask are purposely made larger in size than design layout regions 502, 504.

However, the difference is that unlike edge regions 422, 424, the distances between edge regions 522, 524 are not fixed. In the present embodiment, this distances can be made to vary.

The distance between two edge regions can be based on a number of different characteristics of the edge regions. In one embodiment, the distances between the center lines of the edge regions are used to determine the differences between edge regions. However, in other embodiments, the distances between the edges of the edge regions, themselves, or other parameters can be used to determine the distances between edge regions.

In the embodiment employing center line distances, the distance between the center line of region 522 and region 524, and between region 524 and region 526, etc., is not fixed. In OPC, only the dimension of the pattern line and the location of the pattern line are used as targets. However, in the present embodiment, the location restrictions are removed, permitting variable center line shifts between the regions on the mask.

FIG. 5C illustrates pattern lines 542–548 on wafer 540, created through OPC photolithography from pattern lines 522–528 of mask 520. Between pattern lines 542–548 are regions 550–558. Due to mask 520, the distance shifts between the pattern lines (524, 544, 546, 548) have been permitted to be different from one another. The new target used by the OPC tool is the pattern line width, The result is that by using the modified OPC, the line widths of edge lines 542, 544 are identical to one another, and to lines 546, 548. Accordingly, the electrical conductivity of all the pattern lines is the exact same.

It should also be noted that the modified OPC method can be combined with methods using "dummy" pattern lines.

While the invention has been particularly shown and described with reference to preferred embodiments thereof, it will be understood by those skilled in the relevant art that various changes in form and details may be made therein without departing from the spirit and scope of the invention.

What is claimed is:

1. A method for providing a modified optical proximity correction (OPC) for correcting distortions of pattern lines on a semiconductor circuit wafer, comprising:

producing a mask having one or more pattern regions, said pattern regions comprising one or more non-edge pattern regions located adjacent to other of said non-edge pattern regions on said mask, said pattern regions further comprising one or more edge pattern regions located at or near an area on said mask not having said other non-edge pattern regions, said edge pattern regions having widths calculated to minimize the variance in dimensions between one or more pattern lines on the semiconductor circuit wafer formed therefrom and one or more pattern lines on the semiconductor circuit wafer formed from said non-edge pattern regions, wherein distances between any two of said pattern regions are calculated to minimize the variance in dimensions between said one or more pattern lines formed from said edge pattern regions and said one or more pattern lines formed from said non-edge pattern regions; and producing the semiconductor circuit wafer from said mask having said pattern lines formed from said non-edge pattern regions and having said pattern lines formed from said edge pattern regions, wherein said pattern lines formed from said non-edge regions are permitted to differ in distances therebetween.

2. The method according to claim 1, further comprising:

creating a design layout for said semiconductor circuit wafer; and producing said mask from said design layout.

3. The method according to claim 1, wherein said producing step is performed using optical photolithography.

4. The method according to claim 3, further comprising:

radiating an energy source through said pattern regions, said energy source having a wavelength in the range of the widths of said pattern lines formed from said non-edge pattern regions and the widths of said pattern lines formed from said edge pattern regions.

5. The method according to claim 3, further comprising:

reducing said pattern regions in size by a fixed multiple to produce said pattern lines formed from said non-edge pattern regions and said pattern lines formed from said edge pattern regions.

6. The method according to claim 1, comprising:

using an OPC tool to calculate said widths of said edge pattern regions.

7. The method according to claim 1, wherein said dimensions of said pattern lines are widths of said pattern lines.

8. The method according to claim 1, wherein said any two of said pattern regions comprise one of said non-edge pattern regions and one of said edge pattern regions.

9. The method according to claim 1, wherein said any two of said pattern regions comprise a first of said edge pattern regions and a second of said edge pattern regions.

10. The method according to claim 1, wherein said any two of said pattern regions comprise a first of said pattern regions and a second of said pattern regions positioned adjacent to one another.

* * * * *